US008645927B2

(12) United States Patent
Rammel

(10) Patent No.: US 8,645,927 B2
(45) Date of Patent: Feb. 4, 2014

(54) METHODS AND APPARATUS FOR SIMULATION SPEEDUP

(75) Inventor: Martin G. Rammel, Beavercreek, OH (US)

(73) Assignee: The Boeing Company, Chicago, IL (US)

( * ) Notice: Subject to any disclaimer, the term of this patent is extended or adjusted under 35 U.S.C. 154(b) by 2235 days.

(21) Appl. No.: 10/720,614

(22) Filed: Nov. 24, 2003

(65) Prior Publication Data

US 2005/0114110 A1     May 26, 2005

(51) Int. Cl.
*G06F 9/44*     (2006.01)
*G06F 9/45*     (2006.01)

(52) U.S. Cl.
USPC ............ 717/135; 717/104; 717/109; 717/140

(58) Field of Classification Search
USPC ........................................... 717/135
See application file for complete search history.

(56) References Cited

U.S. PATENT DOCUMENTS

| | | | | |
|---|---|---|---|---|
| 6,163,836 | A * | 12/2000 | Dowling .......................... | 712/37 |
| 6,212,566 | B1 * | 4/2001 | Vanhoof et al. ................ | 709/230 |
| 6,823,505 | B1 * | 11/2004 | Dowling ........................ | 717/140 |
| 6,883,147 | B1 * | 4/2005 | Ballagh et al. ..................... | 716/1 |
| 7,051,317 | B2 * | 5/2006 | Vazquez et al. ................ | 717/104 |
| 7,110,935 | B1 * | 9/2006 | Hwang et al. .................... | 703/20 |
| 7,290,244 | B2 * | 10/2007 | Peck et al. ..................... | 717/109 |
| 7,506,304 | B2 * | 3/2009 | Morrow et al. ................ | 717/109 |
| 8,141,060 | B2 * | 3/2012 | Raghavan et al. ............. | 717/135 |
| 2002/0083420 | A1 * | 6/2002 | Zammit et al. ................. | 717/135 |
| 2002/0103839 | A1 * | 8/2002 | Ozawa .......................... | 708/490 |
| 2002/0152456 | A1 * | 10/2002 | Nightingale et al. ......... | 717/135 |
| 2003/0008684 | A1 * | 1/2003 | Ferris ............................. | 455/561 |
| 2006/0036992 | A1 * | 2/2006 | Hayles et al. .................. | 717/104 |

OTHER PUBLICATIONS

"Floating-point", "Fixed-point", and "Binary point" definitions from Answers.com, pp. 1-3.*
Chen et al., A reconfigurable FPGA-based readback signal generator for hard-drive read channel simulator, Jun. 2002, 6 pages.*
Fummi et al., Native ISS-SystemC Integration for the Co-Simulation of Multi-Processor SoC, Feb. 2004, 6 pages.*
Proctor et al., Numerical Simulation of Aircraft Trailing Vortices, Sep. 2000, 7 pages.*
Cantle A. J., and Devlin M., "A Foundation Architecture for Elevating DSP in FPGAs," Nallatech Ltd, Glasgow, Scotland, MAPLD Technical Program 1999, Paper B4, pp. 1-9, www.nallatech.com.
http://www.mathworks.com/products/simulink/, "Xilinx System Generator for DSP, version 3.1," The MathWorks, Inc., 1994-2003, Web link 1 page, User Guide pp. 1-236.

* cited by examiner

*Primary Examiner* — Thuy Dao

(57) ABSTRACT

A method of performing a numerical simulation includes programming a programmable device using function blocks adapted to perform a respective part of the numerical simulation. Input data are received, and a first portion of the numerical simulation is performed on a standard computer processor. A data path is provided between the processor and the programmable device. A second portion of the numerical simulation is performed on the programmable device, and data from at least one of the first and second portions are exchanged via the data path.

4 Claims, 4 Drawing Sheets ns and Apparatus for Simulation Speedup

Government License Rights

The invention was made with U.S. Government support under Contract No. F33600-99-D-0025. The U.S. Government has certain rights in this invention.

Field of the Invention

The present disclosure relates to methods and apparatus for improving the speed of computational simulations, and more specifically, to speedup of computational simulations using programmable hardware-based solutions.

Background of the Invention

Many different types of physical phenomena may be modeled using numerical simulations. In the field of aerospace engineering, for example, numerical simulations are widely used to predict a variety of phenomena, including airflow over aerodynamic surfaces, electromagnetic scattering from reflective bodies, and mechanical stresses within structures. Examples of computational simulations also may be found in the fields of medical research, electrical engineering, geology, atmospheric sciences, and many other scientific fields. Such simulations may provide valuable information that may otherwise be very difficult and very expensive to determine experimentally. This is particularly true for models which include a large number of operations which would normally be performed in a parallel fashion in the real world but must be performed in serial fashion in the computer model due to a limited number of Central Processing Units (CPU's).

More specifically, in the field of radar, numerical simulations of radar recievers may be used to predict radar performance versus various targets. A common algorithm used in these simulations is the Fast Fourier Transform (FFT) which transforms a digitized waveform in the time domain into a digital representation in the frequency domain. FIG. 1 is a schematic view of a method 10 of performing simulations of the FFT in accordance with the prior art. As shown in FIG. 1, the method 10 includes receiving a first sine wave input 12 and a second swept frequency sine wave input 14. A mathematical converter 16 receives the first and second sine wave inputs 12, 14 via real and imaginary input ports 18, 20, and outputs a corresponding complex number output. An analyzer routine 22 performs a Fast Fourier Transform on the complex number output from the converter 16. Next, a mathematical de-converter 24 receives a FFT output from the analyzer routine 22 in complex form, and de-converts the FFT output into real and imaginary components, and outputs these components via real and imaginary output ports 26, 28, respectively, to a display device 30 (e.g. an oscilloscope) for further review and analysis. Using the simulation results displayed on the display device 30, the scientist or engineer may make further decisions regarding, for example, the frequency sweep of the radar transmitter, resolution of the doppler bins, or the design of the radar system that generates the incident electromagnetic signals. The method 10 is representative of at least some conventional methods for simulating radar signal processing using , one or more of the methods embodied in the SIMULINK simulation software developed by The Mathworks, Inc. of Natick, Mass.

Although desirable results have been achieved using the method 10, there is room for improvement. For example, some efforts to perform radar numerical simulation studies using the method 10 have been hampered by the intensity of the computations, resulting in lengthy computation times. In one case, for example, a numerical simulation of a radar receiver processor utilizing the method 10 required approximately two weeks of CPU time (336 CPU hours) on a modern high-speed computer to provide 1.6 seconds of real-time radar simulation data. Therefore, due to the ever-increasing requirements and demands being placed on numerical simulations there is a continuing impetus to improve the speed and efficiency, and to reduce the cost of such numerical simulations in both time and money.

Summary of the Invention

The present invention is directed to methods and apparatus for improving the speed of computational simulations, and more specifically, to speedup of computational simulations using programmable hardware-based solutions. Apparatus and methods in accordance with the present invention may advantageously increase the speed of computational simulations using cost-effective, hardware-based solutions.

In one embodiment, a method of performing a numerical simulation includes programming a programmable device using function blocks adapted to perform a respective part of the numerical simulation. Input data are received, and a first portion of the numerical simulation is performed on a standard serial processor. A data path is provided between the processor and the programmable device. A second portion of the numerical simulation is performed on the programmable device, and data from at least one of the first and second portions are exchanged via the data path.

Brief Description of the Drawings

The preferred and alternative embodiments of the present invention are described in detail below with reference to the following drawings.

Detailed Description of the Invention

The present invention relates to methods and apparatus for improving the speed of computational simulations, and more specifically, to speedup of simulations using hardware-based solutions. Many specific details of certain embodiments of the invention are set forth in the following description and in FIGS. 2-4 to provide a thorough understanding of such embodiments. One skilled in the art, however, will understand that the present invention may have additional embodiments, or that the present invention may be practiced without several of the details described in the following description.

Apparatus and methods in accordance with the present invention may use programmable devices, such as high density Field Programmable Gate Array (FPGA) chips mounted in PC cards, to run a hardware portion of the simulation. Prior art uses of FPGA chips utilize only a one way path for the circuit design under development and do not include a data path between a running simulation and the portions resident on the programmable device (e.g. FPGA). Apparatus and methods in accordance with the present invention, however, provide function blocks which allow a user to develop simulations which can have all or some of the blocks running in a programmable hardware module (e.g. an FPGA) instead of the serial CPU in the computer and maintain the flow of data and control as if the simulation were running in a high speed simulation.

Figure 1:
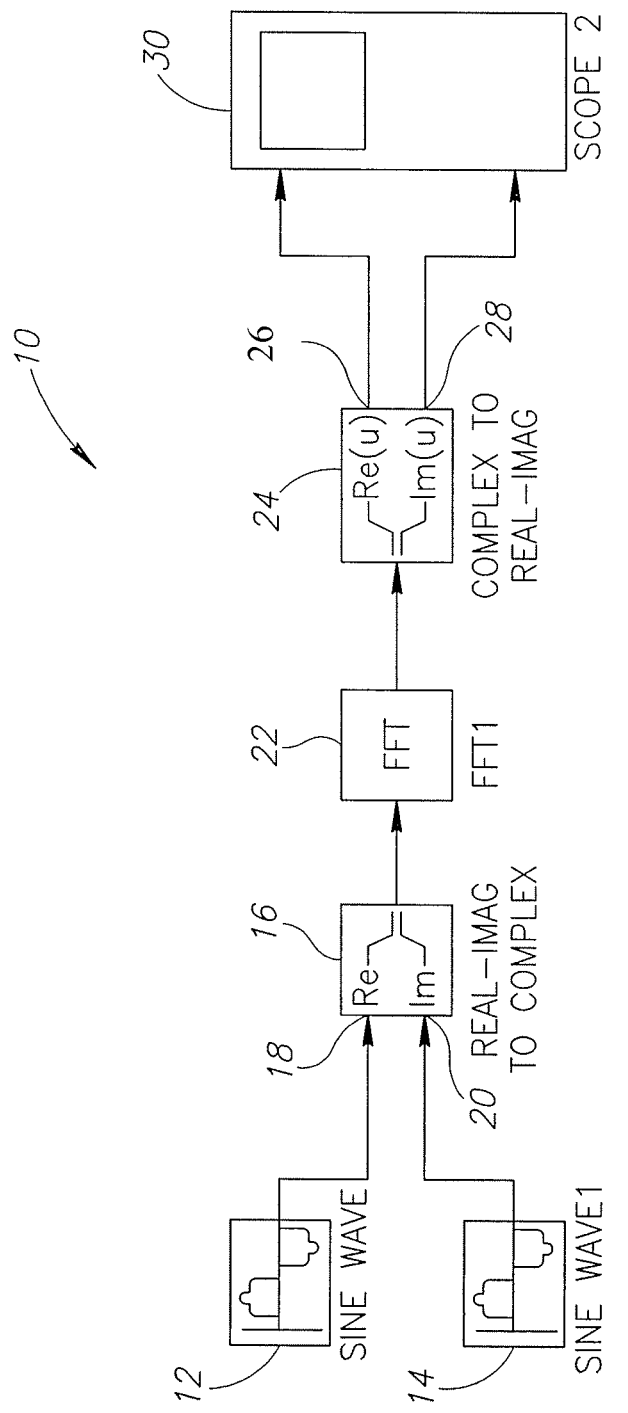
FIG. 1 is a schematic view of a method of performing simulations in accordance with the prior art.
Figure 2:
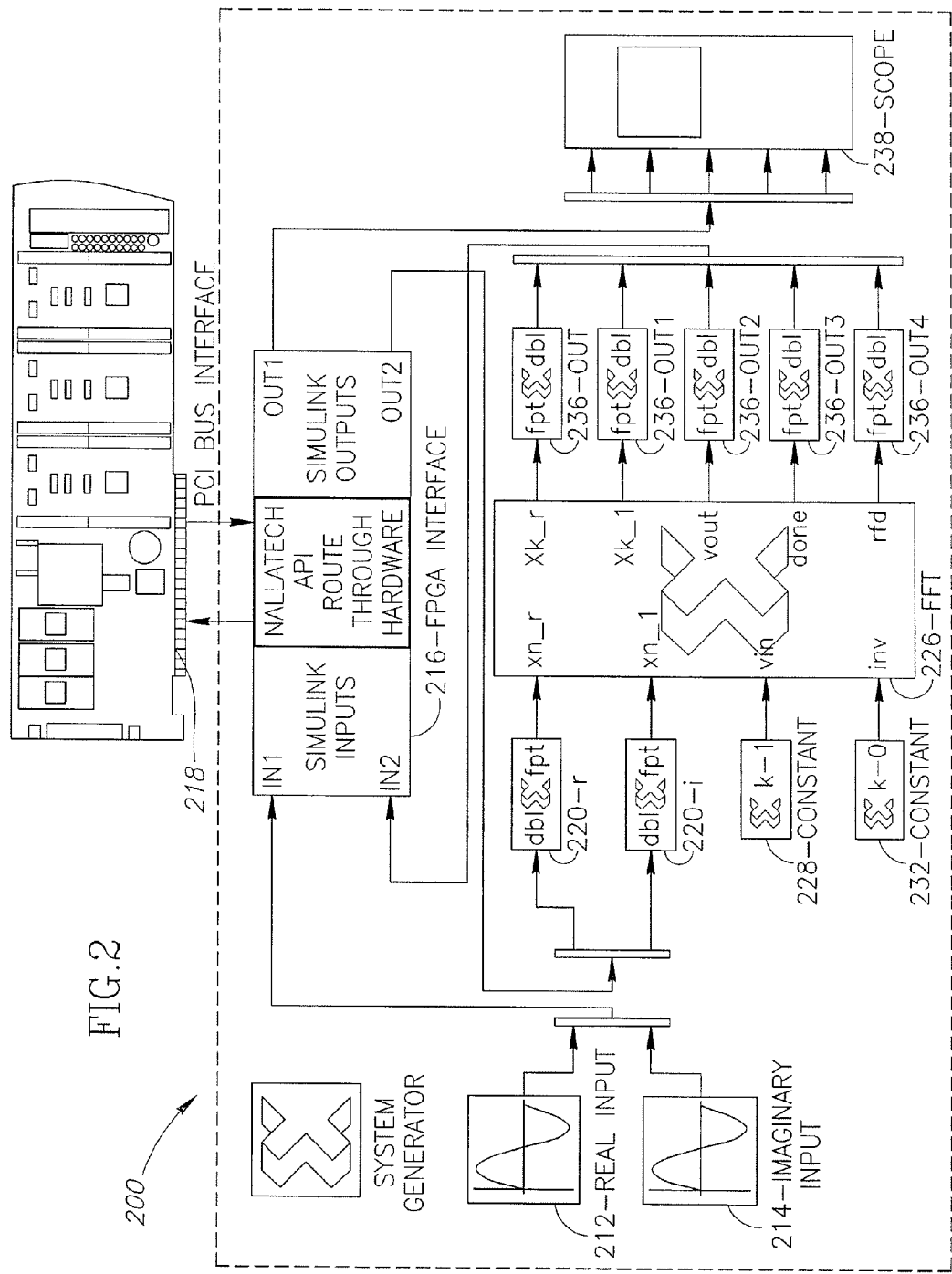
FIG. 2 is a schematic view of a hardware-based method for performing simulations in accordance with an embodiment of the present invention.

FIG. 2 is a schematic view of a hardware-based method 200 of performing simulations in accordance with an embodiment of the present invention. In this embodiment, the method 200 includes receiving first and second sine wave inputs 212, 214 into an FPGA Interface Block 216 that includes a programmable module interface configurable for execution of the user code in Simulink, in hardware or both. This interface block is developed to provide the ability for portions of a running simulation to be executed in the normal manner or in 'Speed Up' mode utilizing the programmable hardware. This custom Simulink block utilizes the hardware interface code provided by the manufacturer such as the FUSE code from Nallatech.

In one embodiment, the programmable module 218 may be a field programmable gate array (FPGA) chip. Alternately, the programmable module 218 may be a Digital Signal Processing (DSP) chip, such as the DSP chips of the type generally offered by Texas Instruments, Incorporated of Dallas, Texas, or Analog Devices, Inc. of Norwood, Massachusetts. In one particular embodiment, the Peripheral Component Interconnect (PCI) bus card 218 may be a Bennuey card of the type commercially-available from Nallatech, Inc. of Orlando, Florida, having a 3 million gate FPGA chip manufactured by Xilinx, Inc. of San Jose, California. The hardware-based method 200 may be provided with a software package that enables the interface module 216 to generate the internal programming code that operates in conjunction with the other components of the method 200. For example, in one particular embodiment of the method 200, it is equipped with the System Generator software available from Xilinx, Inc. that generates VHDL code that operates in conjunction with the above-referenced SIMULINK modeling software.

As further shown in FIG. 2, the first and second sine wave inputs 212, 214 are received into a first input port of the FPGA Interface block 216, and are subsequently output at a first output port to a pair of gateway in blocks 220. Each gateway in block 220 is adapted to convert a double precision input to a suitable fixed point type, and defines limits of the blocks which will be converted by the System Generator code into VHDL code to be run in the hardware. The outputs of the gateway in blocks 220 are coupled to a FFT block 226 which computes a discrete Fourier transform (DFT). In one particular embodiment, the FFT block 226 may use a well-known radix-4 Cooley-Tukey algorithm. The FFT block 226 accepts as input a real component of an input stream xn_r, and an imaginary component of the input stream xn_i from the gateway in blocks 220.

The FFT block 226 provides a real component of the output data stream Xk_r, an imaginary component of the output data stream Xk_i, and a third output vout that marks the output data as valid or invalid. In any of the N inputs of a frame are marked as invalid, then the corresponding output frame will be marked as invalid. A fourth output done is active high on a first output sample in a frame, and a fifth output rfd is active high when the FFT block 226 can accept data.

As further shown in FIG. 2, the output is coupled to a gateway out block 236 that is adapted to convert fixed point data to double precision data, and may also serve as an output point for a top level Hardware Description Language (HDL) design. The outputs of the gateway out blocks 236 are coupled to a second input of the PCI bus card 216, which in turn has a second output leading to a scope 238 for analyzing results. Using the simulation results displayed on the scope 238, the scientist or engineer may make further decisions regarding, for example, the design of the reflective body, or the design of the radar system that generates incident electromagnetic signals.

It will be appreciated that the function blocks 220 through 236 may be VHDL coded in one or more programmable modules 218, such as an FPGA chip or the like, and may provide considerably greater computational speeds in comparison with the prior art. Thus, the hardware-based method 200 may provide significant advantages in computational speed in the performance of numerical simulations.

Figure 3:
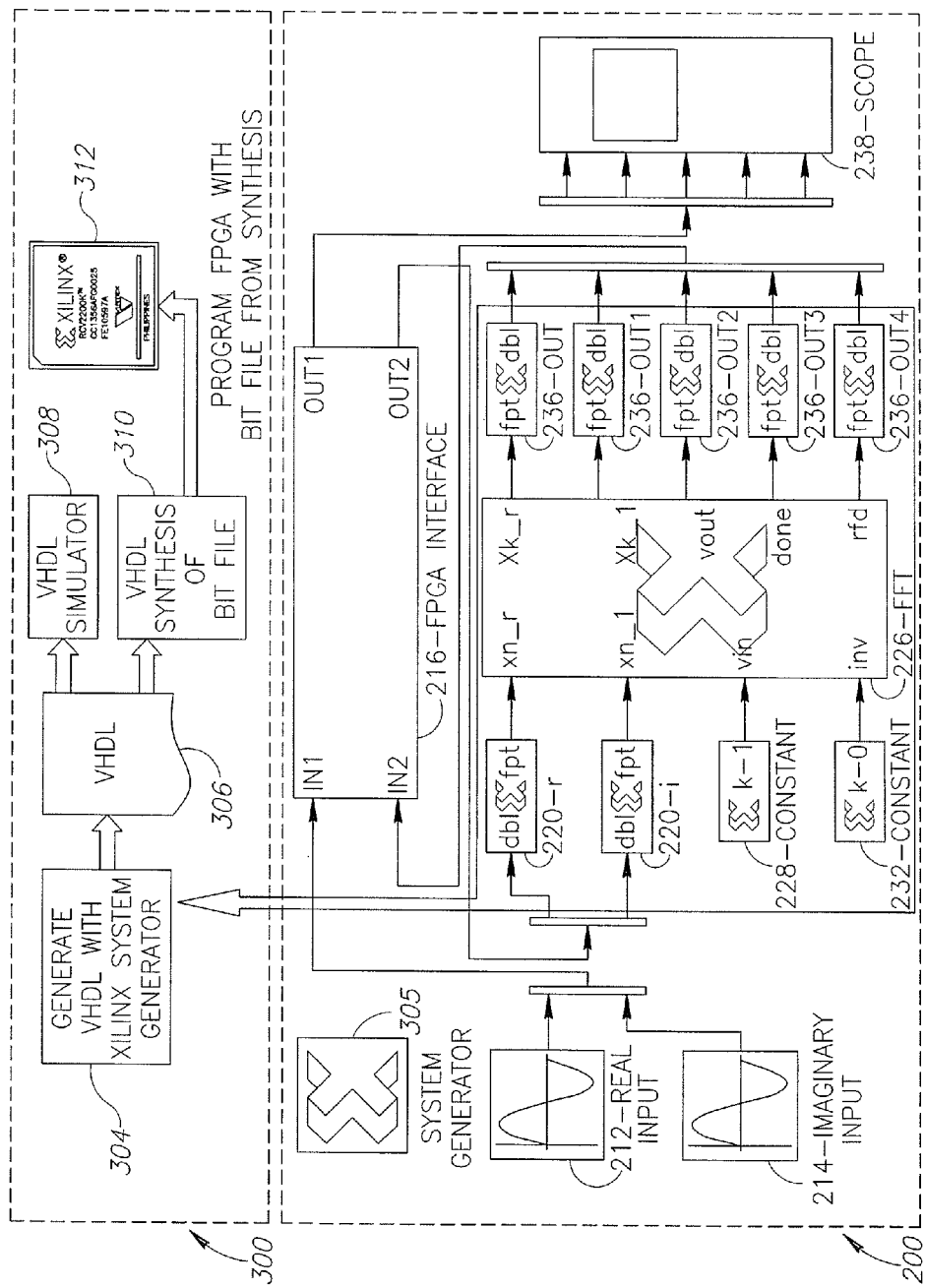
FIG. 3 is a schematic view of the hardware-based method of FIG. 2 showing a process for generating a hardware programming code in accordance with another embodiment of the invention.

FIG. 3 is a schematic view of the development process for the hardware-based method 200 of FIG. 2. In this embodiment, the method 300 includes modeling a design for simulation using, for example, a prior art design tool (e.g. SIMULINK, etc.) in a block 200. In a block 304, the VHDL blocks that form the hardware-based method 200 (e.g. blocks 220 through 236) are generated. In one particular embodiment, the VHDL blocks may be formed using a System Generator software package 305 available from Xilinx. In a block 306, a synthesizeable VHDL code is generated. This VHDL provides the hardware description of the circuits necessary to implement the Simulink diagram functionality. If the specific implementation requires more than one portion of the simulation to be placed in hardware there will be a corresponding number of VHDL files generated. In a block 308, a VHDL simulator can be used to verify the performance of the generated VHDL before further work on the simulation is performed. Once the developer is sure that the generated VHDL code is accurately performing it's function, synthesis of the hardware programming BIT file may proceed. VHDL synthesis is performed in block 310. The end product of the VHDL generation process is a combined VHDL file that specifies all of the hardware to be programmed into the FPGA chip. This file is synthesized into a BIT file which is used to program the gate connections of the FPGA chip to accurately model the circuit diagram being designed. Then, in a block 312, a device is programmed using a Binary Digit (BIT) file from the VHDL synthesis of block 310.

Figure 4:
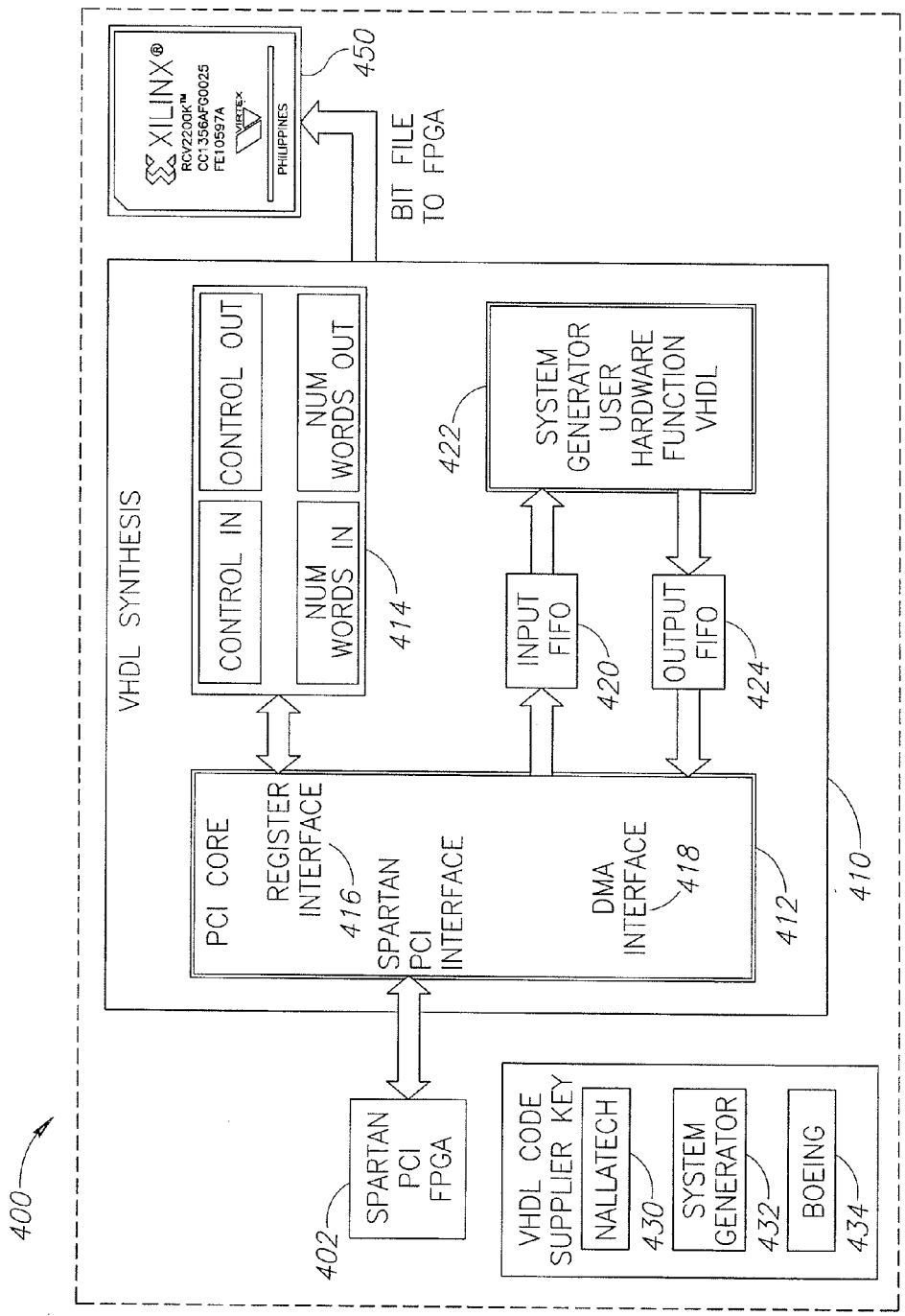
FIG. 4 is a schematic view of the Very High Speed Integrated Circuit Hardware Description Language (VHDL) Synthesis process which is unique part of a hardware-based method for performing simulations in accordance with an embodiment of the present invention.

FIG. 4 is a schematic view of the VHDL Synthesis process. The top level VHDL synthesis 410 includes a communication core block 412 that provides communication between the programmable module 402 and a user developed controller 414 via a register interface 416. A DMA interface 418 of the communication core block 412 is coupled to a user developed interface to the generated VHDL code block. In this embodiment an input First-In-First-Out (FIFO) buffer 420 leading to a VHDL code block 422, and to an output FIFO buffer 424 leading from the VHDL code block 422. The VHDL code block 422 may be any suitable type of VHDL code, including, for example, those VHDL cores accessed from libraries of tested circuits, the System Generator output from Xilinx, and any other suitable VHDL generators, including user-created VHDL code. The various blocks of VHDL code are combined into a single VHDL file for each of the programmable devices. The combined VHDL file is then processed by hardware specific synthesis code, such as Xilinx Synthesis Technology (XST), which produces the hardware configuration BIT File.

Apparatus and methods in accordance with the present invention may provide significant performance increases in comparison with prior art devices. By programming simulations so that computationally intensive portions can be run in programmable modules (e.g. FPGA hardware) using VDHL blocks, the computationally intensive portions of the simulation may run at hardware speeds in parallel for speed increases from 150 to over 60,000 times the prior art simulation speeds.

While various preferred and alternate embodiments of the invention have been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. Apparatus comprising a central processing unit (CPU) and a Field Programmable Gate Array (FPGA) for performing different portions of a numerical simulation;
   the CPU programmed to perform a numerical simulation of sine wave functions representing real and imaginary inputs;
   the FPGA programmed to perform a Fast Fourier Transform (FFT) on the inputs and send results of the FFT back to the CPU, the FPGA also generating a first output that marks data as valid or invalid, a second output that indicates the first sample of each frame, and a third output that indicates when the FFT can accept data;
   the CPU using the results in the numerical simulation and the outputs to maintain data flow with the FPGA.

2. The apparatus of claim 1, wherein the FPGA converts the real and imaginary inputs from double point precision to fixed point prior to performing the transform; and wherein the FPGA converts the results of the FFT from fixed point back to double precision prior to sending the results back to the CPU.

3. The apparatus of claim 1, wherein the CPU performs a numerical simulation of a radar system.

4. The method of claim 1, wherein the FPGA Is programmed to perform steps including:
   receiving the real and imaginary inputs at first and second inputs of an FFT block via a pair of gateway in blocks;
   coupling an output of a double delay block to a third input of the FFT block, the third input being adapted to mark data input as valid or invalid;
   coupling an output of a k=0 block to a fourth input of the FFT block, the fourth input being adapted to control a forward or a reverse transform;
   coupling outputs of the FFT block to at least one D flip flop-based registers adapted to provide a signal latency; and
   coupling the outputs of the registers to at least one gateway out.

* * * * *